(12) United States Patent
Hashiba et al.

(10) Patent No.: US 6,915,498 B2
(45) Date of Patent: Jul. 5, 2005

(54) SEMICONDUCTOR DEVICE PROVIDED USING WIRING DATA OF COMMON DESIGN CORE

(75) Inventors: Yoshiaki Hashiba, Fujisawa (JP); Toshikazu Sei, Kawasaki (JP); Yukinori Uchino, Yokohama (JP); Shinji Fujii, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/190,665

(22) Filed: Jul. 9, 2002

(65) Prior Publication Data

US 2003/0015773 A1 Jan. 23, 2003

(30) Foreign Application Priority Data

Jul. 10, 2001 (JP) .......................... 2001-209682

(51) Int. Cl.[7] .............................................. G06F 17/50
(52) U.S. Cl. ................ 716/12; 716/1; 716/8; 716/11; 716/13; 716/14
(58) Field of Search ................. 716/19, 1; 712/25; 438/671; 365/233, 207; 361/793; 257/775, 690, 666, 211; 174/255

(56) References Cited

U.S. PATENT DOCUMENTS

| | | | | | |
|---|---|---|---|---|---|
| 5,066,997 | A | * | 11/1991 | Sakurai et al. | .............. 257/211 |
| 6,145,073 | A | * | 11/2000 | Cismas | ........................ 712/25 |
| 6,308,143 | B1 | * | 10/2001 | Segawa | .......................... 703/1 |
| 6,518,180 | B1 | * | 2/2003 | Fukuda | ....................... 438/671 |
| 6,528,734 | B2 | * | 3/2003 | Mizunashi | ................... 174/255 |
| 6,611,943 | B2 | * | 8/2003 | Shibata et al. | ................. 716/1 |
| 2002/0036354 | A1 | * | 3/2002 | Yamaguchi et al. | ........ 257/775 |
| 2002/0118593 | A1 | * | 8/2002 | Takemae | ..................... 365/233 |
| 2003/0200520 | A1 | * | 10/2003 | Huggins et al. | .............. 716/16 |

FOREIGN PATENT DOCUMENTS

| | | | | |
|---|---|---|---|---|
| JP | 2000-31288 | | 1/2000 | |
| JP | 2003084419 A | * | 3/2003 | ............ G03F/1/08 |

OTHER PUBLICATIONS

Gansen et al., "A datapath generator for full–custom macros of iterative logic arrays", Jul. 14–16, 1997, ApplicationSpecific Systems, Architectures and Processors, 1997. Proceedings., IEEE International Conference on , pp.: 438–447.*

Araki et al., "Rapid prototyping with HW/SW codesign tool", Mar. 7–12, 1999, Engineering of Computer–Based Systems, 1999. Proceedings. ECBS '99. IEEE Conference and Workshop on , □□pp.: 114–121.*

* cited by examiner

*Primary Examiner*—A. M. Thompson
*Assistant Examiner*—Helen Rossoshek
(74) *Attorney, Agent, or Firm*—Oblon, Spivak, McClelland, Maier & Neustadt, P.C.

(57) ABSTRACT

A semiconductor device includes a plurality of circuits, provided on a semiconductor substrate, each having a plurality of wiring layers. The plurality of circuits are designed using a common design core to which a plurality of wiring data are allocated.

7 Claims, 8 Drawing Sheets

SEMICONDUCTOR DEVICE PROVIDED USING WIRING DATA OF COMMON DESIGN CORE

CROSS-REFERENCE TO RELATED APPLICATIONS

This application is based upon and claims the benefit of priority from the prior Japanese Patent Application No. 2001-209682, filed Jul. 10, 2001, the entire contents of which are incorporated herein by reference.

BACKGROUND OF THE INVENTION

1. Field of the Invention

The present invention relates to a semiconductor device including a circuit having a multilayer wiring structure and, more specifically, to a system LSI to be designed using an IP (intellectual property) core.

2. Description of the Related Art

With development of a fine device structure and a high integration density of a semiconductor device according to progress of process technology, a system LSI including a plurality of function blocks (circuits) in or on one chip has recently been achieved. In this system LSI, a general-purpose function block is efficiently designed reusing an IP core (design core) that is past design resources.

FIG. 7 shows a semiconductor memory chip using an SRAM (Static Random Access read write Memory) as an example of a system LSI.

In the case of the semiconductor chip 100, when the device is designed, part of the device logic section 102 is designed using an SRAM design core 101 that is an IP core. Therefore, the development and design can be effectively carried out.

However, the system LSI includes various types of function blocks according to the specification of the device (product). For example, some function blocks have a four-level wiring structure and other function blocks have a five-level wiring structure. Further, some function blocks having the same number of wiring layers include a thick wiring layer like a function block whose uppermost wiring layer serves as a power line or a high-speed signal line.

For the reasons described above, conventionally, IP cores must be prepared for every each type of function blocks in order to improve efficiency of the design of the system LSI.

FIGS. 8A and 8B show an example of a system LSI in which two different function blocks IP1 and IP2 are provided on a single chip. FIG. 8A is a plan view of the chip and FIG. 8B is a cross-sectional view showing a main part (wiring layers) of the chip.

Referring to FIGS. 8A and 8B, the function block IP1 corresponding to an IP core IP1a includes a four-level layer structure having four wiring layers M1 to M4. It is seen from FIG. 8B that the wiring layers M1 to M4 have the same wiring pitch and the same thickness (thin wiring layers).

At the time of designing the system LSI, the IP core IP1a having wiring data for forming each of the wiring layers M1 to M4 is read out from a library and used, as illustrated in FIGS. 9A and 9B.

As shown in FIG. 10B, the function block IP2 corresponding to an IP core IP2a includes a four-level layer structure having four wiring layers M1 to M4. The wiring layers M1 to M3 in these wiring layers M1 to M4 have the same wiring pitch and the same thickness (thin wiring layers).

The wiring pitch of the uppermost wiring layers M4 is wider than the wiring layers M1 to M3 and each of the wiring layers M4 is thicker than each of the wiring layers M1 to M3. Each of the thick uppermost wiring layers M4 is used as the power supply line, the signal line or the like.

At the time of designing the system LSI, the IP core IP2a having wiring data for forming each of the wiring layers M1 to M4 is read out from the library and used, as illustrated in FIG. 10A.

FIGS. 11A and 11B show an example of a system LSI in which three different function blocks IP3, IP4 and IP5 are provided on a single chip. FIG. 11A is a plan view of the chip and FIG. 11B is a cross-sectional view showing a main part (wiring layers) of the chip.

Referring to FIG. 11A, the function block IP3 corresponding to an IP core IP3a is formed to include a five-level layer structure having five wiring layers M1 to M5. It is seen from FIG. 11B that the wiring layers M1 to M5 have the same wiring pitch and the same thickness (thin wiring layers).

The function block IP4 corresponding to an IP core IP4a includes a five-level layer structure having five wiring layers M1 to M5. The wiring layers M1 to M4 in these wiring layers M1 to M5 have the same wiring pitch and the same thickness (thin wiring layers), as is seen from FIG. 11B.

The wiring pitch of the uppermost wiring layers M5 is wider than the wiring layers M1 to M4 and each of the wiring layers M5 is thicker than each of the wiring layers H1 to M4. Each of the thick uppermost wiring layers M5 is used as the power supply line, the signal line or the like.

The function block IP5 corresponding to an IP core IP5a includes a four-level layer structure having four wiring layers M1 to M4. The wiring layers M1 to M3 in these wiring layers M1 to M4 have the same wiring pitch and the same thickness (thin wiring layers), as is seen from FIG. 11B.

The wiring pitch of the uppermost wiring layers M4 is wider than the wiring layers M1 to M3 and each of the wiring layers M4 is thicker than each of the wiring layers M1 to M3. Each of the thick uppermost wiring layers M4 is used as the power supply line, the signal line or the like.

In this case, also, the IP core IP3a for forming each of the wiring layers M1 to M5 of the function block IP3, the IP core IP4a for forming each of the wiring layers M1 to M5 of the function block IP4, and the IP core IP5a for forming each of the wiring layers M1 to M4 of the function block IP5 are stored in the library.

As described above, an IP core adapted to the type of the function block (more specifically the structure of wiring layers) is read out from the library and used to design a general-purpose function block to be formed on a chip. Therefore, it is necessary to prepare IP cores for every each function block of different type in order to design the function blocks with efficiency.

Therefore, general-purpose function blocks can be efficiently designed reusing IP cores. However, there is a problem that PI cores are prepared for each of function blocks of different types.

BRIEF SUMMARY OF THE INVENTION

A semiconductor device according to an aspect of the present invention comprises a plurality of circuits, provided on a semiconductor substrate, each having a plurality of wiring layers, the plurality of circuits being designed using a common design core to which a plurality of wiring data are allocated.

A semiconductor device according to another aspect of the present invention comprises first and second circuits, provided on a semiconductor substrate, each having a plurality of multilayer wiring layers, the first and second circuits being designed using a common design core to which wiring data corresponding to a first multilayer wiring structure common to the first and second circuits and a second wiring layer located on the first multilayer wiring structure is allocated.

EMBODIMENTS

Embodiments will now be described with reference to the accompanying drawings.

Figure 1A:
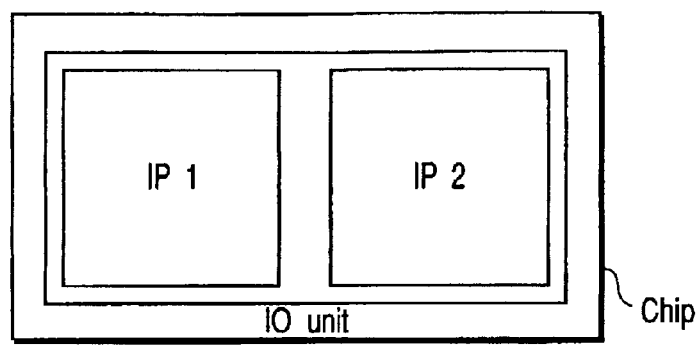
FIGS. 1A and 1B is a schematic diagram showing a system LSI (four-layer device) according to a first embodiment.
Figure 1B:
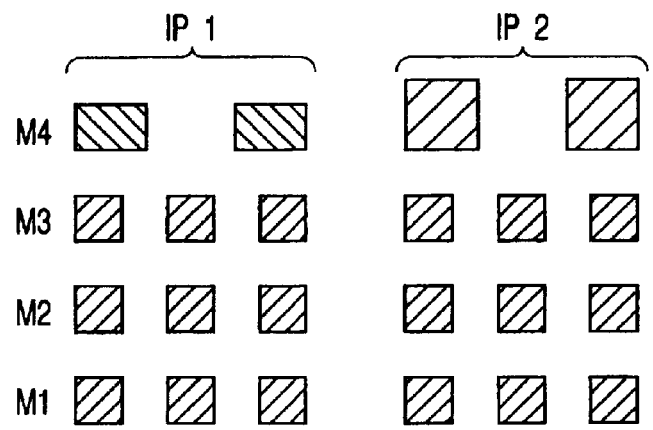

FIGS. 1A and 1B show an example of a system LSI according to a first embodiment. The first embodiment is directed to a four-layer device in which two function blocks (circuits) IP1 and IP2 each having four-level wiring layers are provided on a single chip. FIG. 1A is a plan view of the chip and FIG. 1B is a cross-sectional view of a main part (wiring layers) of the chip.

Referring to FIGS. 1A and 1B, the function block (second circuit) IP1 is produced to have a four-level layer structure having four wiring layers M1 to M4. The wiring layers M1 to M3 in these wiring layers M1 to M4 have the same wiring pitch and the same thickness (thin wiring layers).

The uppermost wiring layers M4 (at least part of the plurality of wiring layers) have a wiring pitch wider than the wiring layers M1 to M3 and the same thickness as the wiring layers M1 to M3 (thin wiring layer).

On the contrary, the function block (first circuit) IP2 is provided to have a four-level layer structure having four wiring layers M1 to M4. The wiring layers M1 to M3 in these wiring layers M1 to M4 have the same wiring pitch and the same thickness (thin wiring layers).

The wiring pitch of the uppermost wiring layers (at least part of the plurality of wiring layers) M4 is wider than the wiring layers M1 to M3 and is thicker than the wiring layers M1 to M3. The thick uppermost wiring layers M4 are used as the power supply line, the signal line, or the like.

In the case where the system LSI includes function blocks IP1 and IP2 having the multilayer wiring structure with different types, it will be designed using a common IP core (design core) described later.

Figure 2A:
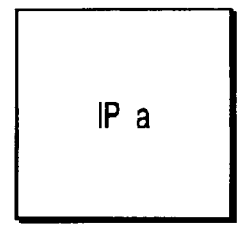
FIGS. 2A and 2B show an example of a common IP core used for designing the four-layer device.
Figure 2B:
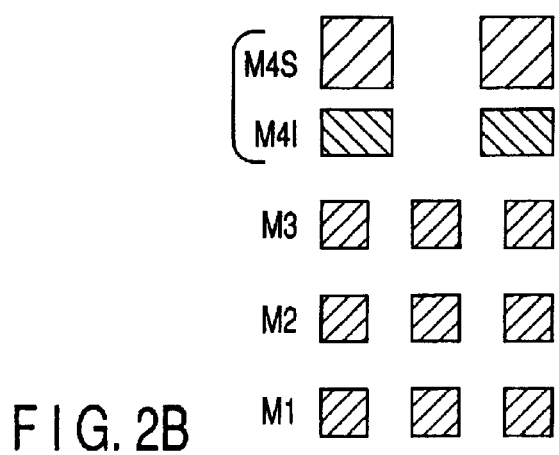

FIGS. 2A and 2B show an example of the common IP core IPa used for designing the foregoing four-layer device.

In the case of the common IP core IPa, in the wiring layers M1 to M4, wiring data M1 to M3 for forming the wiring layers M1 to M3 have the same wiring pitch and the same thickness (thin wiring layers).

In FIG. 2B, M4I and M4S indicate wiring data for producing the uppermost wiring layers M4. The wiring data (second wiring data) M4I has a wiring pitch wider than the wiring layers M1 to M3 and the same thickness as that of each of the wiring layers M1 to M3 (thin wiring layers).

In contrast, the wiring data (first wiring data) M4S has the same wiring pitch as that of the wiring data M4I (the pitch is wider than the wiring layers M1 to M3) and a thickness which is thicker than each of the wiring layers M1 to M3. The wiring data M4S is thick wiring layers.

As described above, the two wiring data M4I and M4S having the wiring pitch and different thickness are allocated to the common IP core IPa in accordance with the uppermost wiring layers (at least part of the wiring layers) M4.

Figure 3:
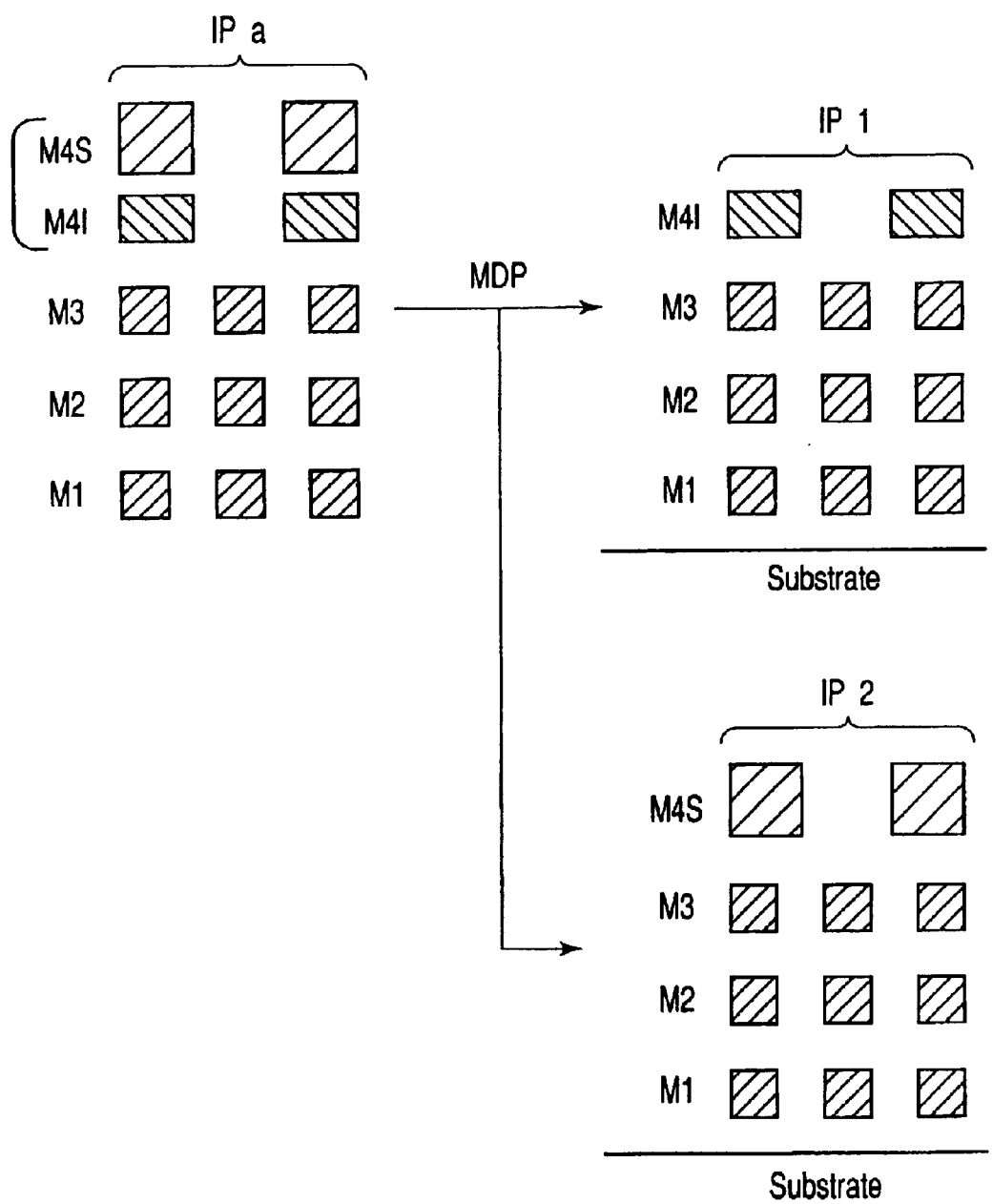
FIG. 3 is a diagram explaining a method of designing the four-layer device using the common IP core.

When the above four-layer device is designed, the common IP core IPa is read out from a library and thus can be used to form two function blocks IP1 and IP2 of different types according to the specifications of the device as shown in, e.g., FIG. 3.

More specifically, when the function block IP1 is produced, MDP (mask data processing) is accomplished to produce the uppermost wiring layers M4 using the wiring data M4I of the common IP core IPa. When the function block IP2 is produced, the MDP is done to form the uppermost wiring layers M4 using the wiring data M4S of the common IP core IPa. Thus, the common IP core can be easily used to form the function block IP1 having the thin wiring layers as the uppermost wiring layers M4 or to form the function block IP2 having the thick wiring layers as the uppermost wiring layers M4.

As described above, a plurality of wiring data having the wiring pitch in common can be selected in accordance with the type of function blocks.

Wiring data for producing both the thin wiring layers and the thick wiring layers, which have the wiring pitch in common, are provided as the wiring data of the IP core to form the uppermost wiring layers. Thus, one IP core can be used to design a plurality of function blocks of different types. Therefore, it can be possible to employ one IP core for designing a plurality of function blocks with different types. Consequently, the IP cores need not be prepared for every function blocks of different types and the function blocks can be designed with efficiency.

Figure 4A:
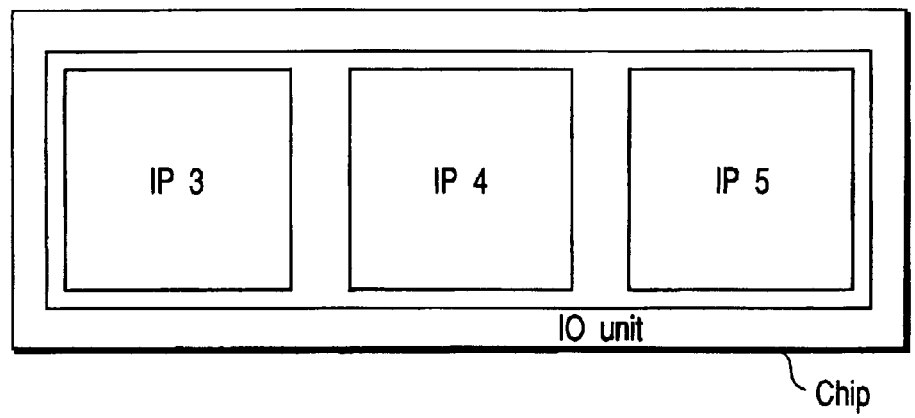
FIGS. 4A and 4B are schematic diagrams showing a system LSI (five-layer device) according to a second embodiment.
Figure 4B:
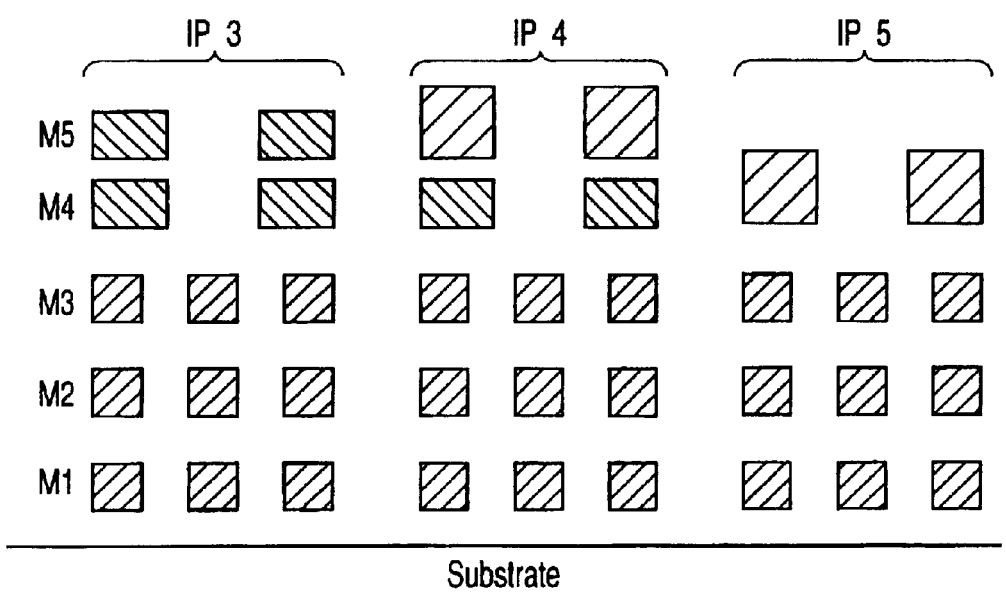

FIGS. 4A and 4B show an example of a system LSI according to a second embodiment. The second embodiment is directed to a five-layer device in which three function blocks (circuits) IP3, IP4 and IP5 having a given number of multilayer wiring layers are provided on a single chip. In this device, the use of a thin fourth wiring layers M4 as the power supply line or the signal line causes a shortage of the current-carrying capacity, and therefore the capacity is reinforced with the fifth wiring layers M5. FIG. 4A is a plan view of the chip and FIG. 4B is a cross-sectional view showing a main part (wiring layers) of the chip.

Referring to FIGS. 4A and 4B, the function block (second circuit) IP3 is produced as a five-level layer structure having five wiring layers M1 to M5. The wiring layers M1 to M3 in these wiring layers M1 to M5 have the same wiring pitch and the same thickness (thin wiring layers).

The fourth wiring layers M4 (at least part of the plurality of wiring layers or at least one intermediate wiring layer) have a wiring pitch wider than the wiring layers M1 to M3 and the same thickness as the wiring layers M1 to M3 (thin wiring layer).

The uppermost wiring layers M5 (at least part of the plurality of wiring layers) have the same wiring pitch as the wiring layers M4 (the wiring pitch is wider than the wiring layers M1 to M3) and the same thickness as the wiring layers M1 to M4 (thin wiring layer).

The fourth wiring layers M4 are used as the power supply line, the signal line or the like. The uppermost wiring layers M5 are used to reinforce the current-carrying capacity that is decreased due to the use of the fourth wiring layers M4 for power supply line, the signal line or the like.

On the other hand, the function block (first circuit) IP4 is formed as a five-level layer structure having five wiring layers M1 to M5. The wiring layers M1 to M3 in these wiring layers M1 to M5 have the same wiring pitch and the same thickness (thin wiring layers).

The fourth wiring layers M4 (at least part of the plurality of wiring layers or at least one intermediate wiring layer) have a wiring pitch wider than the wiring layers M1 to M3 and the same thickness as the wiring layers M1 to M3 (thin wiring layers).

The uppermost wiring layers M5 (at least part of the plurality of wiring layers) have the same wiring pitch as the fourth wiring layers M4 (the wiring pitch is wider than the wiring layers M1 to M3) and a thickness thicker than the wiring layers M1 to M4. Therefore, the uppermost wiring layers M5 are the thick wiring layers.

In this case, the fourth wiring layers M4 are used as the power supply line, the signal line or the like. The uppermost wiring layers M5 are used to reinforce the current-carrying capacity that is decreased due to the use of the thin fourth wiring layers M4 for the power supply line, the signal line or the like.

The function block (third circuit) IP5 is provided as a four-level layer structure having four wiring layers M1 to M4. The wiring layers M1 to M3 in these wiring layers M1 to M4 have the same wiring pitch and the same thickness (thin wiring layers).

The uppermost wiring layers M4 (at least part of the plurality of wiring layers) have a wiring pitch wider than the wiring layers M1 to M3 and a thickness thicker than the wiring layers M1 to M3. Therefore, the uppermost wiring layers M4 are thick wiring layers. The thick uppermost wiring layers M4 are used as the power supply line, the signal line, or the like.

The system LSI having function blocks IP3, IP4 and IP5 whose multilayer wiring structures are different in type is designed using a common IP core (design core) that will be described later.

Figure 5A:
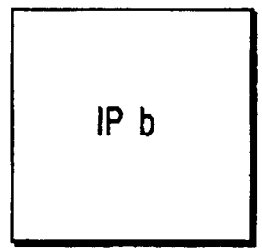
FIGS. 5A and 5B show an example of a common IP core used for designing the five-layer device.
Figure 5B:
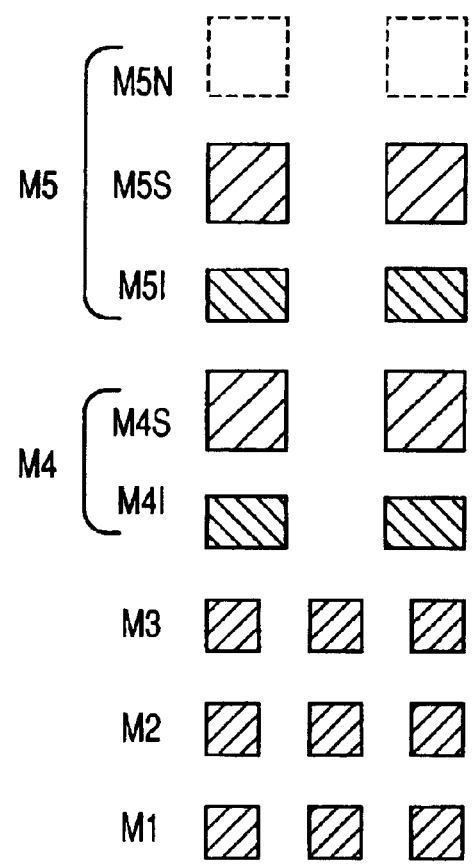

FIGS. 5A and 5B show an example of a common IP core IPb used for designing the foregoing five-layer device.

In the case of the common IP core IPb, the wiring layers M1 to M3 in the wiring layers M1 to M5 have the same wiring pitch and the same thickness (thin wiring layers).

In FIG. 5B, M4I and M4S indicate wiring data for producing the fourth wiring layers M4. The wiring data M4I (second wiring data) has a wiring pitch wider than the wiring layers M1 to M3 and the same thickness as that of each of the wiring layers M1 to M3 (thin wiring layers).

The wiring data M4S (first wiring data) has the same wiring pitch as the wiring data M4I (the pitch is wider than the wiring layers M1 to M3) and a thickness thicker than the wiring layers M1 to M3. The wiring data M4S includes therefore thick wiring layers.

In FIG. 5B, M5I, M5S and M5N indicate wiring data for producing the uppermost wiring layers M5 respectively. The wiring data M5I (second wiring data) has the same wiring pitch as the wiring layers M4 (the pitch is wider than the wiring layers M1 to M3) and the same thickness as that of each of the wiring layers M1 to M3 (thin wiring layer).

The wiring data M5S (first wiring data) has the same wiring pitch as the wiring data M5I (the pitch is wider than the wiring layers M1 to M3) and a thickness thicker than the wiring layers M1 to M3. The wiring data M5S includes therefore thick wiring layers.

The wiring data M5N (third wiring data) serves as dummy data to prevent the fifth (uppermost) wiring layers M5 from being formed when the fourth wiring layers M4 are so thick that the power supply need not be reinforced.

As described above, the two wiring data M4I and M4S having the wiring pitches in common and also having different thickness are allocated to the common IP core IPb corresponding to the fourth wiring layers M4, and the three wiring data M5I, M5S and M5N having the wiring pitches in common and having also different thickness are allocated to the common IP core IPb corresponding to the uppermost wiring layers M5.

The wiring pitch of each of the wiring data M4I and M5I for forming the thin wiring layers is equal to that of the wiring data M4S and M5S for producing the thick wiring layers.

Figure 6:
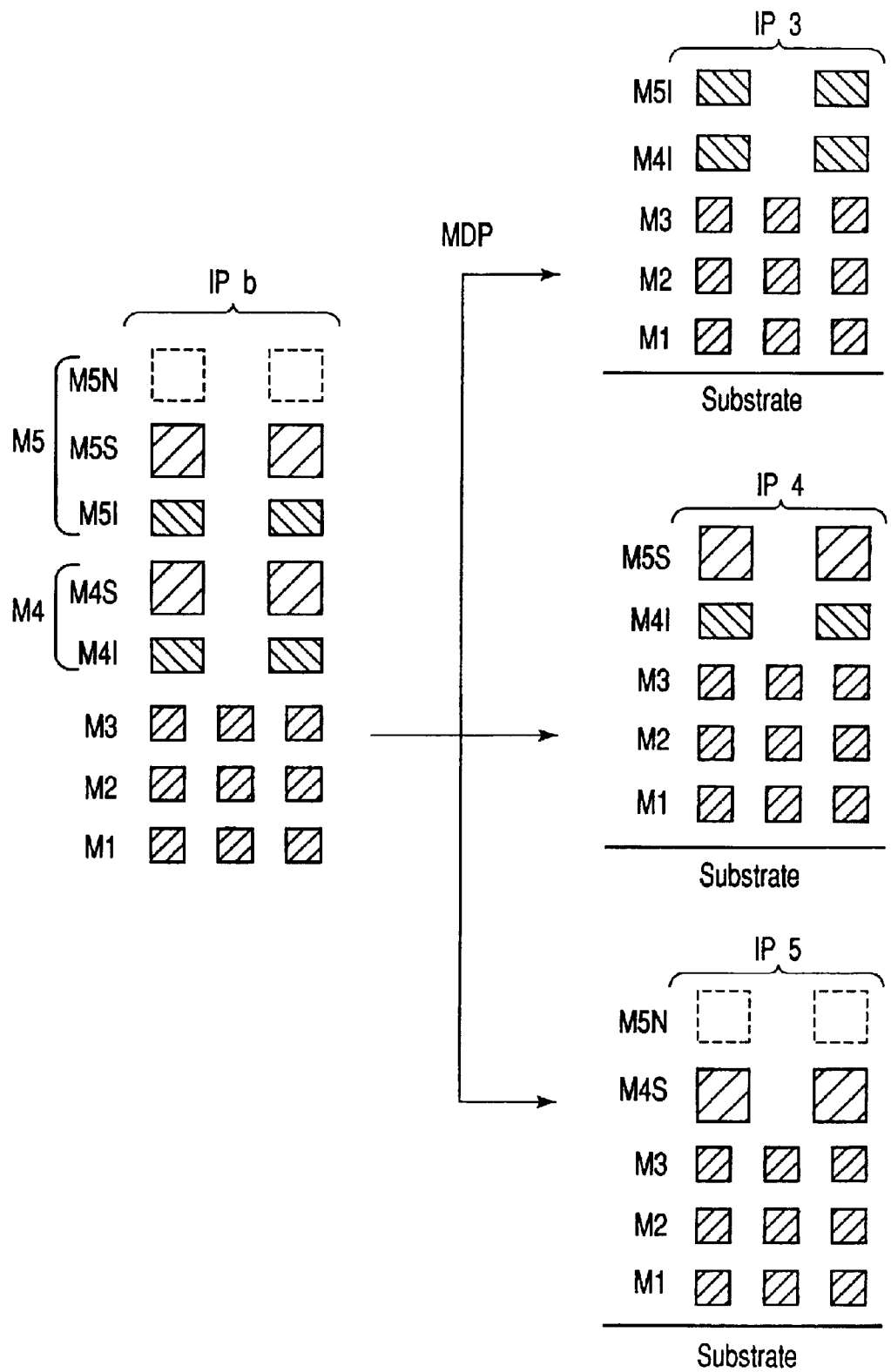
FIG. 6 is a diagram explaining a method of designing the five-layer device using the common IP core.
Figure 7:
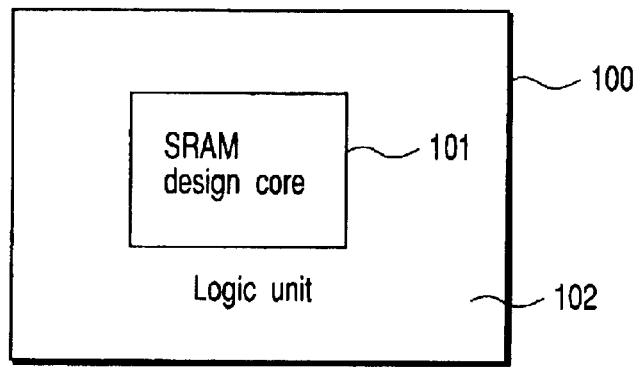
FIG. 7 is a schematic diagram of a system LSI taking a semiconductor memory chip using an SRAM as an example in order to explain prior art and its problems.
Figure 8A:
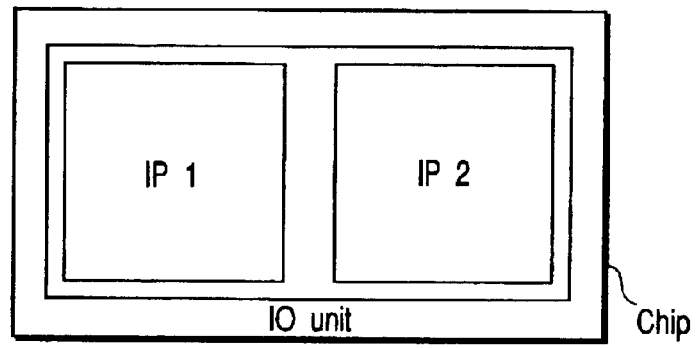
FIGS. 8A and 8B are schematic diagrams showing a prior art system LSI (four-layer device).
Figure 8B:
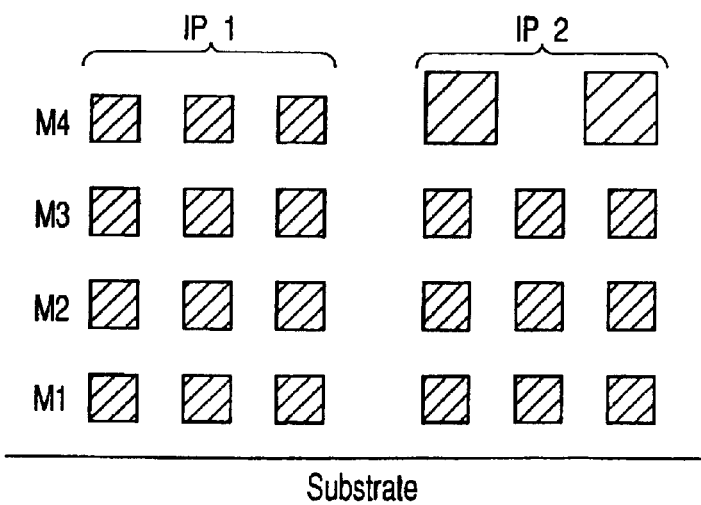
Figure 9A:
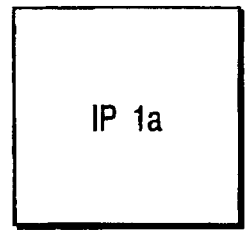
FIGS. 9A and 9B show an example of an IP core used for designing the prior art four-layer device.
Figure 10A:
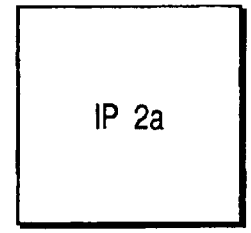
FIGS. 10A and 10B show another example of the IP core used for designing the prior art four-layer device.
Figure 9B:
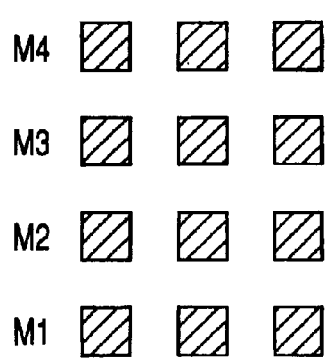
Figure 10B:
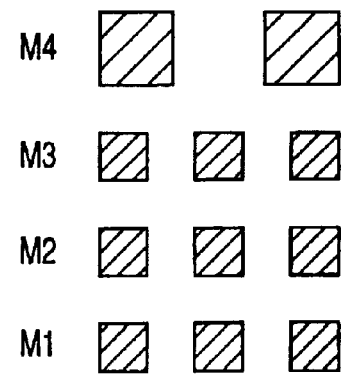
Figure 11A:
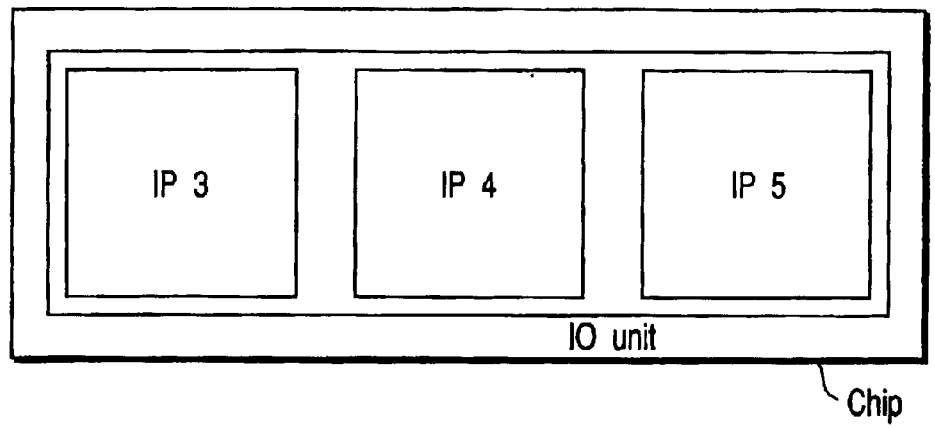
FIGS. 11A and 11B are schematic diagrams showing a prior art system LSI (five-layer device).
Figure 11B:
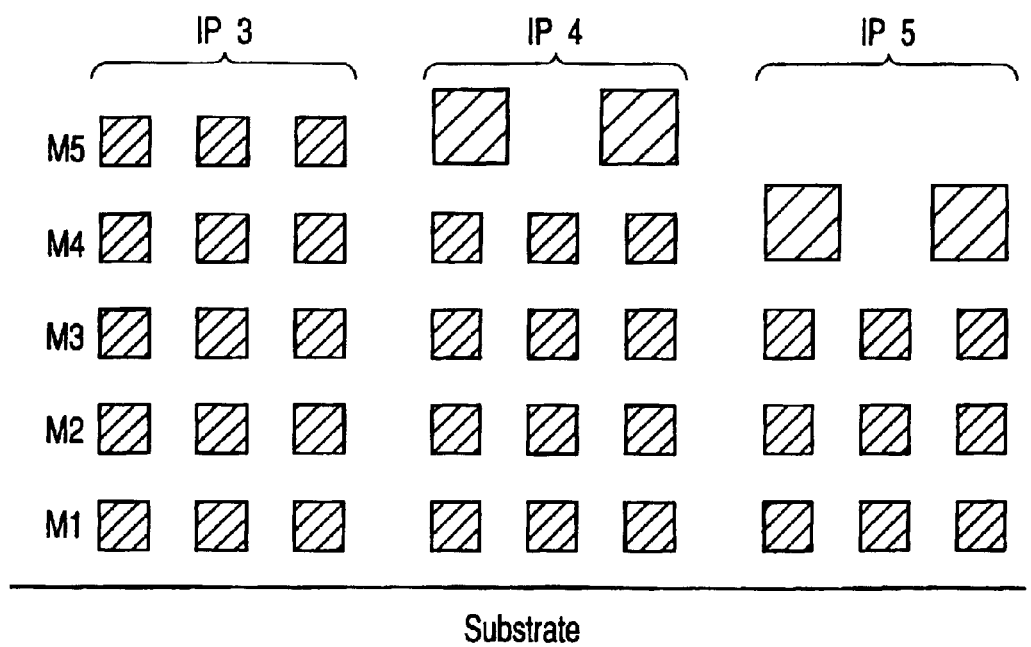

Accordingly, when the above five-layer device is designed, the common IP core IPb will be read out from the library and thus can be used to form three function blocks IP3, IP4 and IP5 with different types according to the specifications of the device as shown in, e.g., FIG. 6.

That is, the common IP core IPb is subjected to the MDP (Mask Data Processing) to obtain the wiring layer structure of each of function blocks IP3, IP4 and IP5.

For example, for producing the function block IP3, the MDP is executed to form the wiring layers M4 and M5 using the wiring data M4I and M5I of the common IP core IPb. When the function block IP4 is produced, the MDP is executed to form the wiring layers M4 and M5 using the wiring data M4I and M5S of the common IP core IPb. When the function block IP5 is formed, the MDP is executed to form the wiring layers M4 and M5 using the wiring data M4S and M5N of the common IP core IPb.

Thus, the common IP core can be easily used to produce the function block IP3 that reinforces the current-carrying capacity decreased in the fourth wiring layers M4 with the thin uppermost wiring layers M5, the function block IP4 that reinforces the current-carrying capacity with the thick uppermost wiring layers M5, or the function block IP5 that need not reinforce the current-carrying capacity with the uppermost wiring layers M5.

In the five-layer device according to the second embodiment, also, the IP core need not be prepared for each of function blocks of different types and thus the function blocks can be designed with efficiency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:

a semiconductor substrate; and plurality of functional blocks provided on the semiconductor substrate, each having a multilayer wiring structure different in type from each other, the plurality of functional blocks being provided using a plurality of wiring data in a common design core, wherein the wiring data are subjected to MDP (Mask Data Processing) to provide the wiring structure of each of the functional blocks.

2. The semiconductor device according to claim 1, wherein the wiring data are allocated to the common design core.

3. The semiconductor device according to claim 1, wherein the common design core has multilayer wiring data.

4. A semiconductor device comprising:

a semiconductor substrate;

first and second circuits formed on the semiconductor substrate, each providing functional blocks whose functions differ from each other, each of the functional blocks having a multilayer wiring structure; and the first and second circuits being provided using a common design core to which wiring data corresponding to both a first multilayer wiring layer common to the first and second circuits and a second wiring layer located on the first multilayer wiring layer is allocated, wherein the wiring data is subjected to MDP (Mask Data Processing) to provide a multilayer wiring structure of each of the first and second circuits.

5. The semiconductor device according to claim 4, further comprising a third circuit formed on the semiconductor substrate and having another multilayer wiring structure, the third circuit being designed using a common design core to which wiring data corresponding to the first multilayer wiring layer common to the first and second circuits, the second wiring layer located on the first multilayer wiring layer and the third wiring layer located on the second wiring layer is allocated.

6. The semiconductor device according to claim 5, wherein the wiring data corresponding to the third wiring layer is dummy data.

7. The semiconductor device according to claim 5, wherein the third wiring layer is a wiring layer to reinforce one of a power supply line and a signal line.

* * * * *